(12) United States Patent
Garagnani et al.

(10) Patent No.: US 10,477,736 B2
(45) Date of Patent: Nov. 12, 2019

(54) ELECTROMAGNETIC ENERGY SEAL FOR ADJOINING BUILDING MODULES

(71) Applicant: Armag Corporation, Bardstown, KY (US)

(72) Inventors: David Garagnani, Bardstown, KY (US); Chris Sutton, Prospect, KY (US)

(73) Assignee: Armag Corporation, Bardstown, KY (US)

( * ) Notice: Subject to any disclaimer, the term of this patent is extended or adjusted under 35 U.S.C. 154(b) by 0 days.

(21) Appl. No.: 16/142,715

(22) Filed: Sep. 26, 2018

(65) Prior Publication Data
US 2019/0104651 A1   Apr. 4, 2019

Related U.S. Application Data

(60) Provisional application No. 62/567,350, filed on Oct. 3, 2017.

(51) Int. Cl.
*H05K 9/00* (2006.01)
*E04B 1/348* (2006.01)
*E04B 1/68* (2006.01)

(52) U.S. Cl.
CPC ......... *H05K 9/0001* (2013.01); *E04B 1/3483* (2013.01); *E04B 1/6813* (2013.01); *H05K 9/0086* (2013.01)

(58) Field of Classification Search
CPC .................................................. H05K 9/0001
USPC .......................................................... 174/350
See application file for complete search history.

(56) References Cited

U.S. PATENT DOCUMENTS 4,902,851 A * 2/1990 Richter ..................... E06B 5/18
174/357

* cited by examiner

*Primary Examiner* — Stanley Tso
(74) *Attorney, Agent, or Firm* — Frost Brown Todd LLC

(57) ABSTRACT

An electromagnetic seal is provided for preventing the transmission of electromagnetic energy between corresponding walls of adjoining building modules. The seal includes a first support extending inwardly from an end of a first building module, a second support extending inwardly from an end of a second building module, and a gasket assembly compressed between the first support and the second support.

14 Claims, 9 Drawing Sheets

ELECTROMAGNETIC ENERGY SEAL FOR ADJOINING BUILDING MODULES

PRIORITY

This application claims priority to U.S. Provisional Patent Application No. 62/567,350, entitled "Radio-Frequency Seal For Adjoining Building Modules," filed on Oct. 3, 2017, the disclosures of which are incorporated by reference herein.

BACKGROUND

Prefabricated steel building modules are typically assembled by fastening the open sides of each building module together by a series of bolt connections through pre-drilled holes. Continuously welded steel seams are then typically used in the manufacturing process in the corner, floor, and ceiling joints of the building modules. In some instances, it may be desirable to adjoin two or more steel building modules at a destination site. However, when the open sides of two or more building modules are assembled at the destination, such continuous welding may not be an option. For example, such continuous welding may burn the paint coating off the two welded components, it may add cost due to the need to send certified welders out to do field work, and some destinations may have environmental concerns that would prohibit welding, etc. It may therefore be desirable to provide a seal that allows untrained personnel to easily adjoin two or more building modules at the destination site.

Continuously welded steel seams in the building modules prevent radio frequency (RF) energy from leaking through. Because the continuous welding may not be available at the destination site, the bolted module seams between adjoining building modules are a potential weakness where Radio-Frequency Interference (RFI), or Electromagnetic Interference (EMI), energy can enter the building modules. This energy can disrupt and permanently damage susceptible electronic equipment. Some harmful forms of EMI energy are High Altitude Electromagnetic Pulse (HEMP), Electromagnetic Pulse (EMP), high-power electromagnetics (HPEM), and intentional electromagnetic interference (IEMI). These module seams are also a potential weakness where electronically transmitted Sensitive Compartmented Information (SCI) may escape the building's protected volume. Therefore, it may also be desirable to provide a seal for the building module seam, in conjunction with industry standard environmental and weather tight sealing measures, that reduces or eliminates electromagnetic energy propagation, such as RFI, EMI, and SCI, in and out of the modular shelter.

While a variety of electromagnetic seals have been made and used, it is believed that no one prior to the inventors has made or used an invention as described herein.

BRIEF DESCRIPTION OF THE DRAWINGS

It is believed the present invention will be better understood from the following description of certain examples taken in conjunction with the accompanying drawings, in which like reference numerals identify the same elements and in which.

Figure 1:
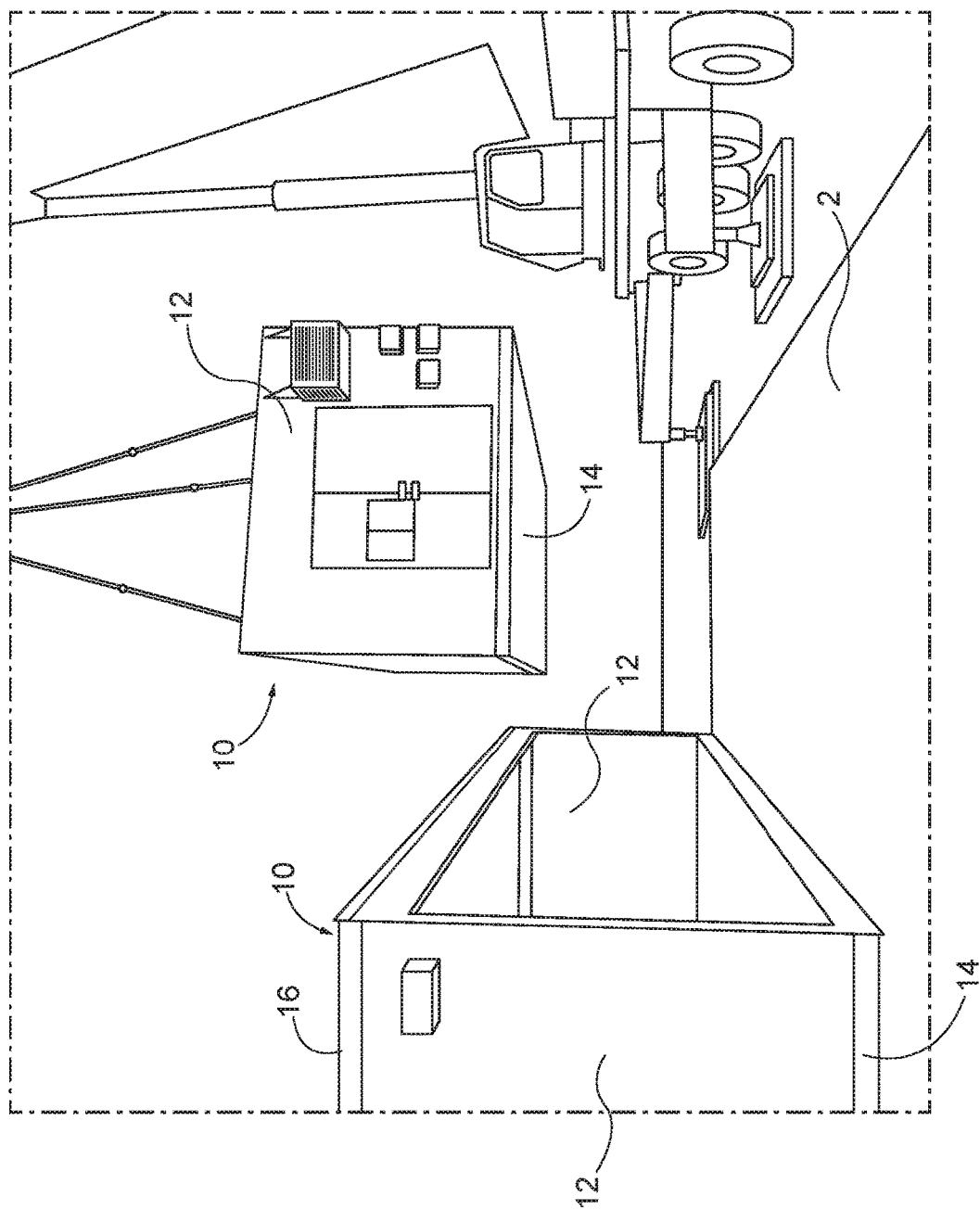
FIG. 1 depicts a schematic of a building module being installed.

The drawings are not intended to be limiting in any way, and it is contemplated that various embodiments of the invention may be carried out in a variety of other ways, including those not necessarily depicted in the drawings. The accompanying drawings incorporated in and forming a part of the specification illustrate several aspects of the present invention, and together with the description serve to explain the principles of the invention; it being understood, however, that this invention is not limited to the precise arrangements shown.

DETAILED DESCRIPTION

The following description of certain examples of the invention should not be used to limit the scope of the present invention. Other examples, features, aspects, embodiments, and advantages of the invention will become apparent to those skilled in the art from the following description, which is by way of illustration, one of the best modes contemplated for carrying out the invention. As will be realized, the invention is capable of other different and obvious aspects, all without departing from the invention. Accordingly, the drawings and descriptions should be regarded as illustrative in nature and not restrictive.

There is a desire for a seal to adjoin two or more steel building modules that is easy to install at a destination site and that reduces or eliminates electromagnetic energy from leaking through the seam. Electromagnetic energy may include RFI, EMI, and/or SCI data transmission. For instance, electromagnetic energy attenuated by this seal may include energy having a frequency between about 0 hertz and about 18 gigahertz. Such a seal includes a gasket assembly easily inserted into a metal support assembly that serves as a conductive connection to prevent electromagnetic energy leakage between the building module seams.

Referring to FIG. 1, a building module (10) is shown being installed at a destination site adjacent to another building module (10). As shown in the illustrated embodiment, each building module (10) includes a floor (14), a ceiling (16), and two end walls (12). The floor (14), ceiling (16), and end walls (12) of each building module (10) have been fastened together by a series of bolt connections through pre-drilled holes (not shown). The four seams between the floor (14), ceiling (16), and end walls (12) were then flashed and caulked to prevent rain and other elements from entering each building module (10). The building modules (10) are typically set on a prepared concrete slab (2) and may be adjoined by aligning the end walls (12) of the building modules (10) on the concrete slab (2). A seal (50) (see FIG. 2) may then be used to adjoin each of the building modules (10) at the corner, floor, and/or ceiling joints.

Figure 2:
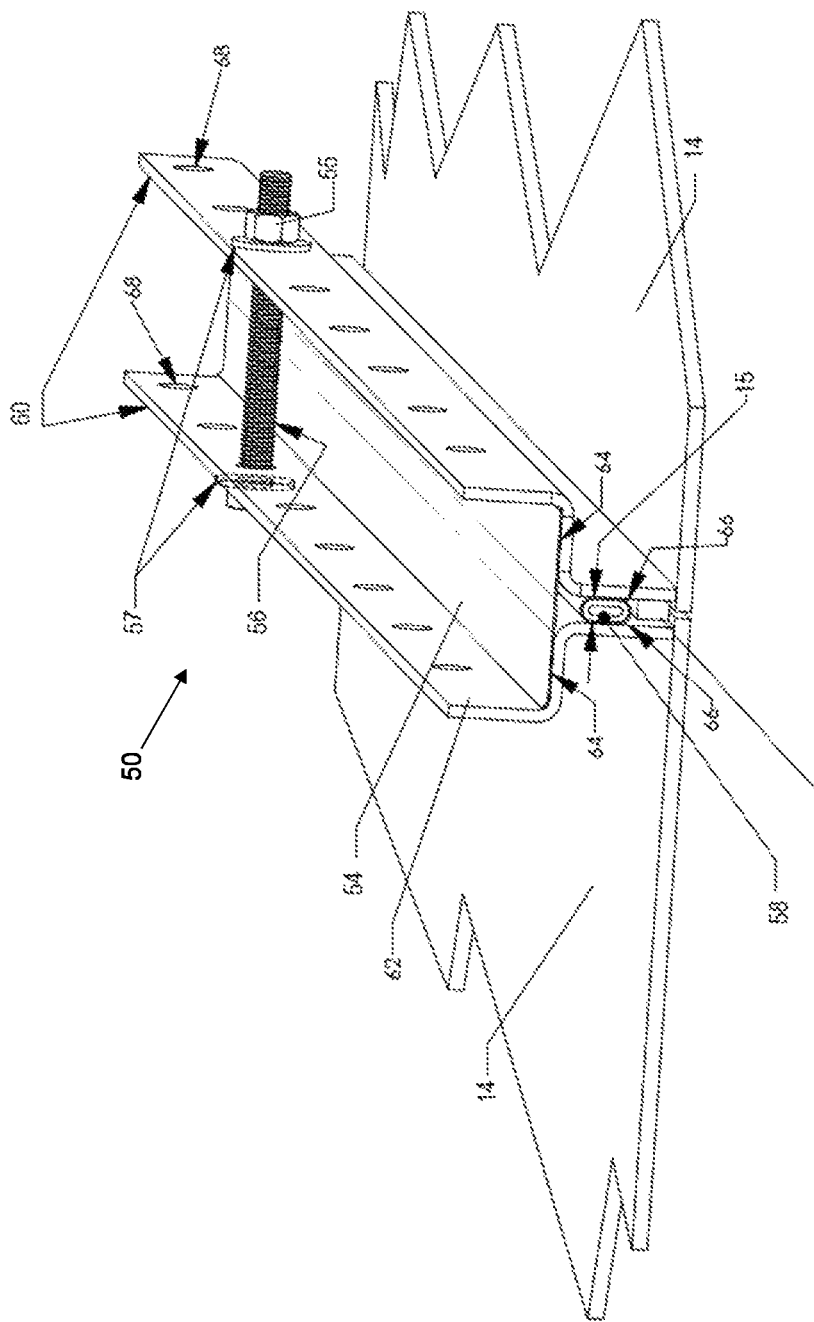
FIG. 2 depicts a perspective view of an electromagnetic seal for use with the building module of FIG. 1.
Figure 3:
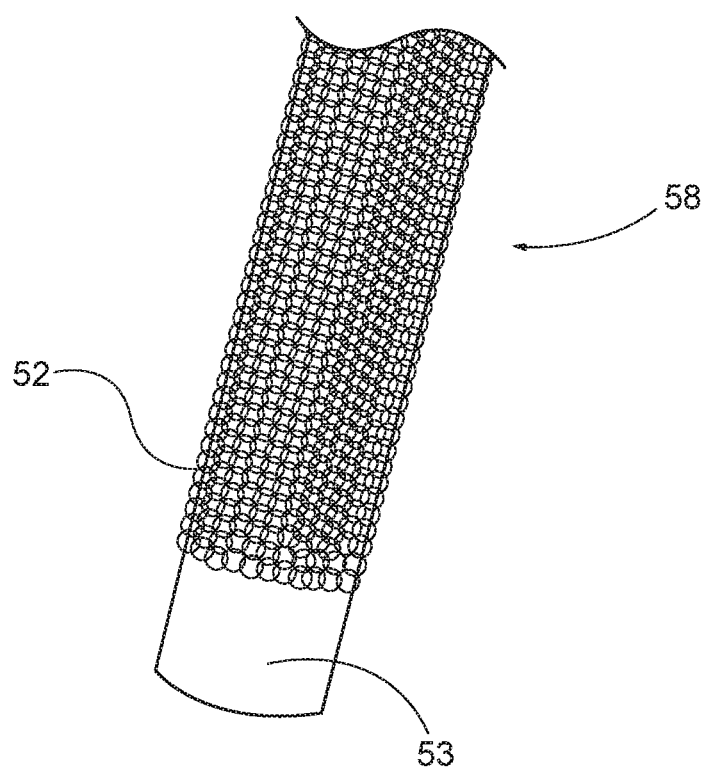
FIG. 3 depicts a perspective view of a gasket assembly of the electromagnetic seal of FIG. 2.

Referring to FIG. 2, the seal (50) comprises a gasket assembly (58) inserted between a pair of supports (60), with a tape (54) applied over the seam. The gasket assembly (58) comprises a tube (53) wrapped in a wire mesh (52), as shown in FIG. 3. The tube (53) can be made from silicone, or any other suitable material, that is sufficiently flexible to compress into building module (10) seams. For instance, the tube (53) can have an outer diameter that is wider than the module seam such that when the building modules (10) are bolted together, the tube (53) serves as a gasket. The tube (53) is hollow with about a half inch outer diameter in the present embodiment, but other suitable configurations can be used. The wire mesh (52) can be a woven steel mesh, such as those manufactured by Laird Technologies, Parker Chomerics, Tech-Etch, Majr Products, Leader Tech, etc. The wire mesh (52) can be metalized or plated in tin to protect it from rust. The wire mesh (52) is sufficiently flexible such that it can compress with the tube (53) when it is inserted into the module seam. In some versions, the wire mesh (52) is wrapped once around the tube (53) to provide a single layer. In some other versions, the wire mesh (52) is wrapped more than once around the tube (53) to provide multiple layers. Other suitable configurations for the gasket assembly (58) will be apparent to one with ordinary skill in the art in view of the teachings herein.

Figure 4:
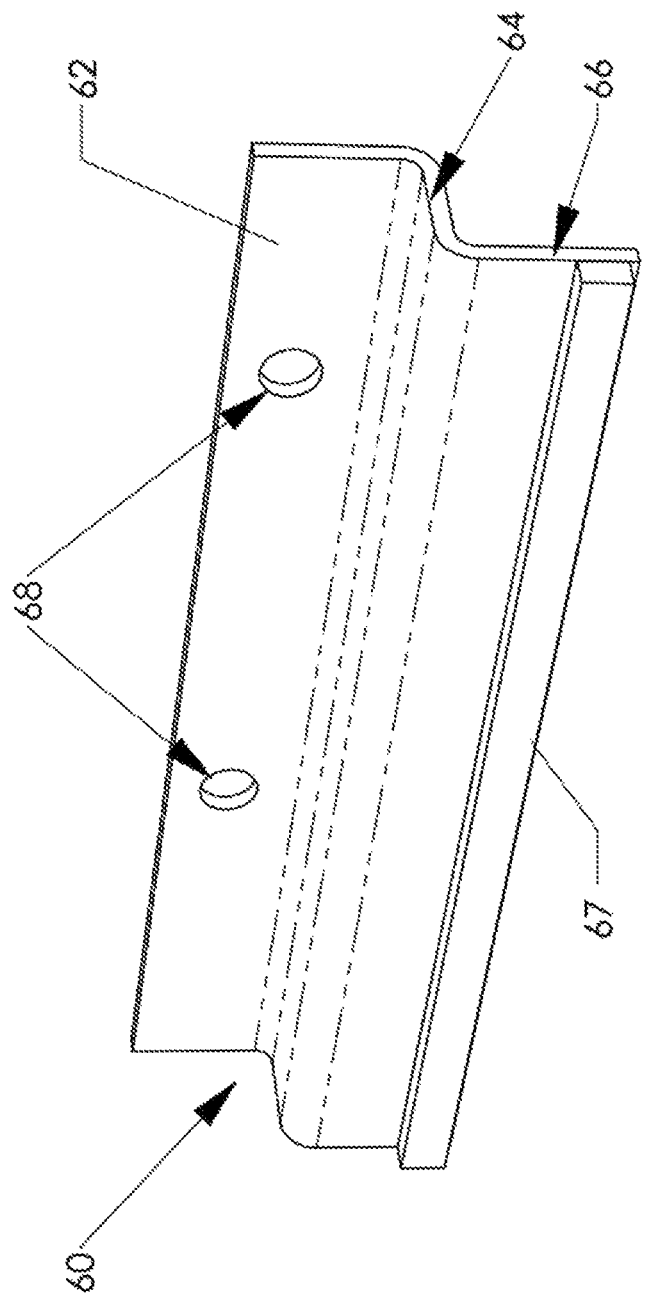
FIG. 4 depicts a perspective view of a support of the electromagnetic seal of FIG. 2.
Figure 5:
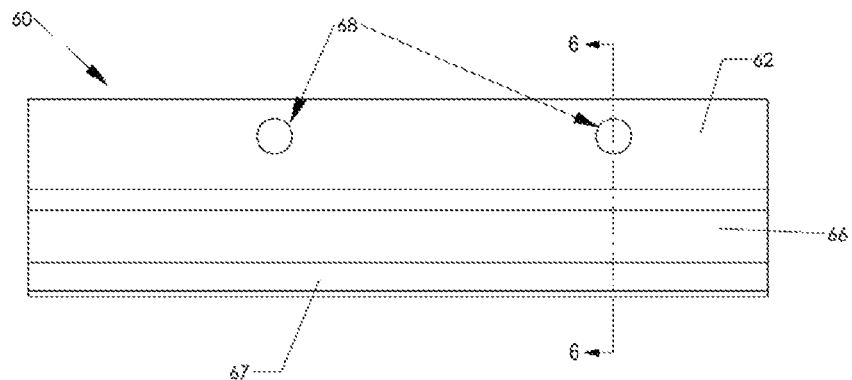
FIG. 5 depicts a front view of the support of FIG. 4.
Figure 6:
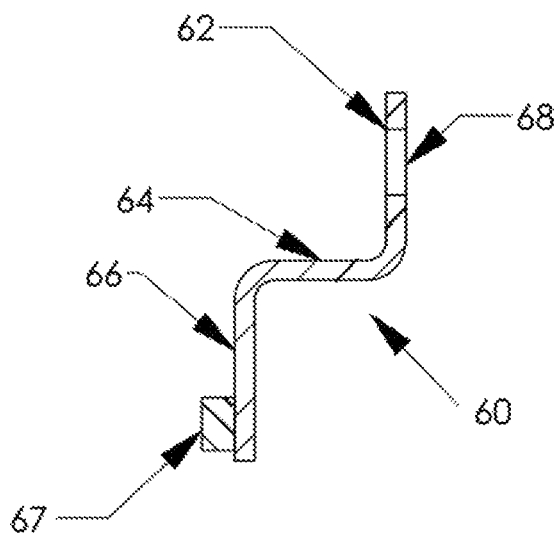
FIG. 6 depicts a cross-sectional view of the support of FIG. 4 taken along line 6-6 of FIG. 5.
Figure 7A:
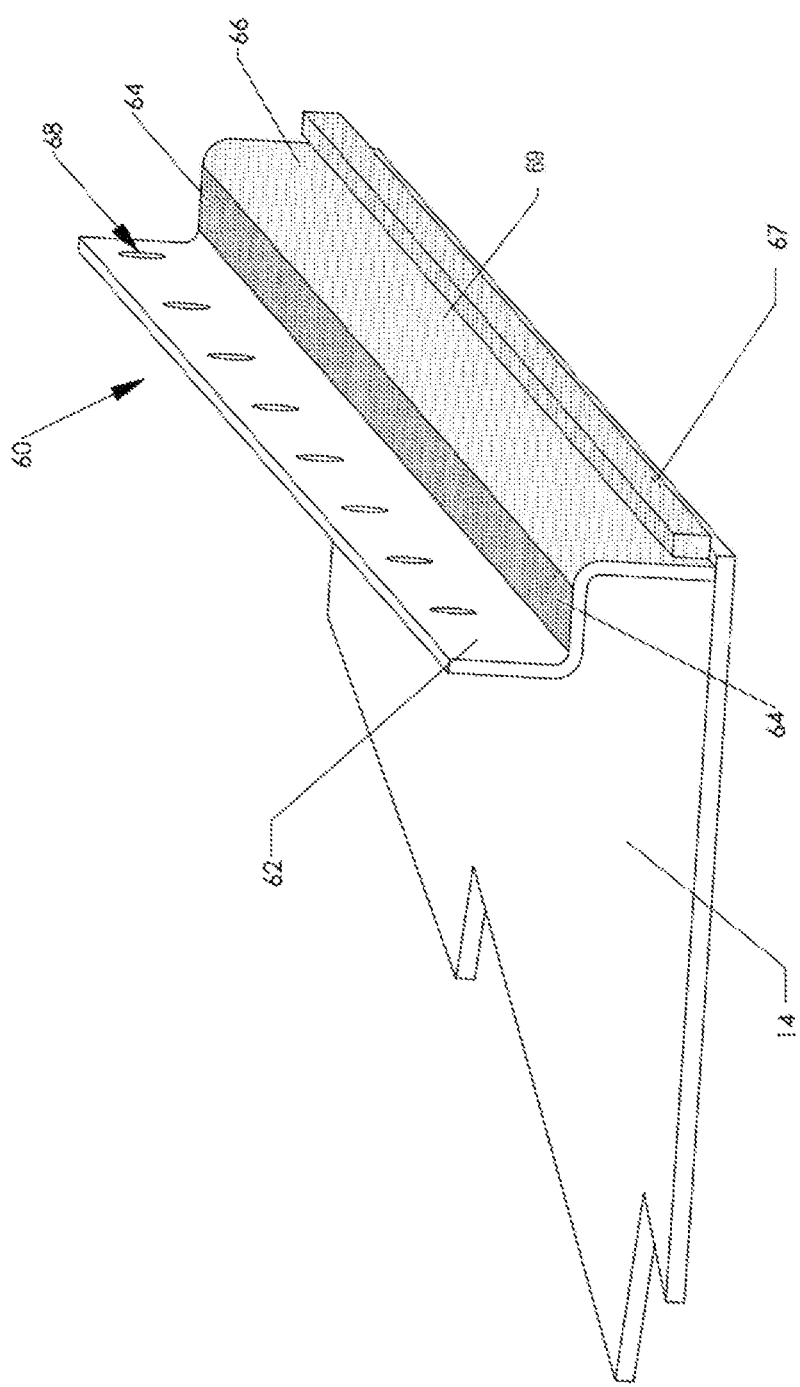
FIG. 7A depicts a perspective view of the electromagnetic seal of FIG. 2 being installed, showing a first support of the electromagnetic seal coupled to a surface of the building module.

A support (60) of the seal (50) is shown in more detail in FIGS. 4-6. The support (60) comprises a first wall (62), a second wall (64), and a third wall (66). The second wall (64) extends inwardly from an end of the first wall (62) such that the second wall (64) is substantially perpendicular relative to the first wall (62). The third wall (66) then extends from the other end of the second wall (64) away from the first wall (62) such that the third wall (66) is substantially perpendicular relative to the second wall (64) and substantially parallel relative to the first wall (62). The support (60) thereby forms a Z-shape configuration. The corners of the support (60) formed between the walls (62, 64, 66) can be rounded with a radius between about ¼ inch and about 1 inch. Such rounded corners can facilitate insertion of the gasket assembly (58) and avoid pinching of the gasket assembly (58). The support (60) can be made from steel, such as between about a 3 gauge steel and a 16 gauge steel, stainless steel, aluminum, or any other suitable conductive material. The support (60) can be metalized or coated to protect it from rust. For instance, the support (60) can be metalized by flame spraying the support (60) with tin to optimize protection of the steel and maintain a conductive surface as discussed in more detail below. The entire surface of the support (60) or a selected portion of the support (60) can be metalized. In the illustrated embodiment, the interior surface of the third wall (66) and the second wall (64), as shown by the shaded area (69) in FIG. 7A, is metalized.

Referring back to FIGS. 4-6, the support (60) further comprises at least one opening (68) that may receive a bolt (56), or other suitable fastener, to couple the support (60) with another support (60). In the illustrated embodiment, at least one opening (68) is pre-drilled on an upper portion of the support (60) at the first wall (62), but other areas of the support (60) can be used. By providing more than one opening (68), the supports (60) can be coupled at selectable and adjustable positions along each support (60). The openings (68) may further allow the gap between the supports (68) to be adjusted by tightening and/or loosening the bolt (56). As shown in FIGS. 4-6, the support (60) further comprises a compression stop (67) coupled to an interior surface of the third wall (66). The compression stop (67) may be configured to abut the gasket assembly (58) to prevent the gasket assembly (58) from being inserted too far between the supports (60). The compression stop (67) may be made of mild steel, or any other suitable conductive material. The compression stop (67) can be metalized or plated in tin to protect it from rust. In some versions, the compression stop (67) may be sufficiently resilient such that it compresses against an adjacent support (60). Other suitable configurations for the support (60) will be apparent to one with ordinary skill in the art in view of the teachings herein.

Referring back to FIG. 2, a tape (54) is then positioned over the seam of the gasket assembly (58) and adhered on the second wall (64) of each support (60). The tape (54) can comprise a metalized fabric and an aluminum foil layer. A conductive adhesive can be used to apply the tape (54) to the supports (60). Accordingly, the tape has a suitable conductivity of less than about 0.07 ohms per square. Other suitable configurations for the tape (54) will be apparent to one with ordinary skill in the art in view of the teachings herein.

Figure 7B:
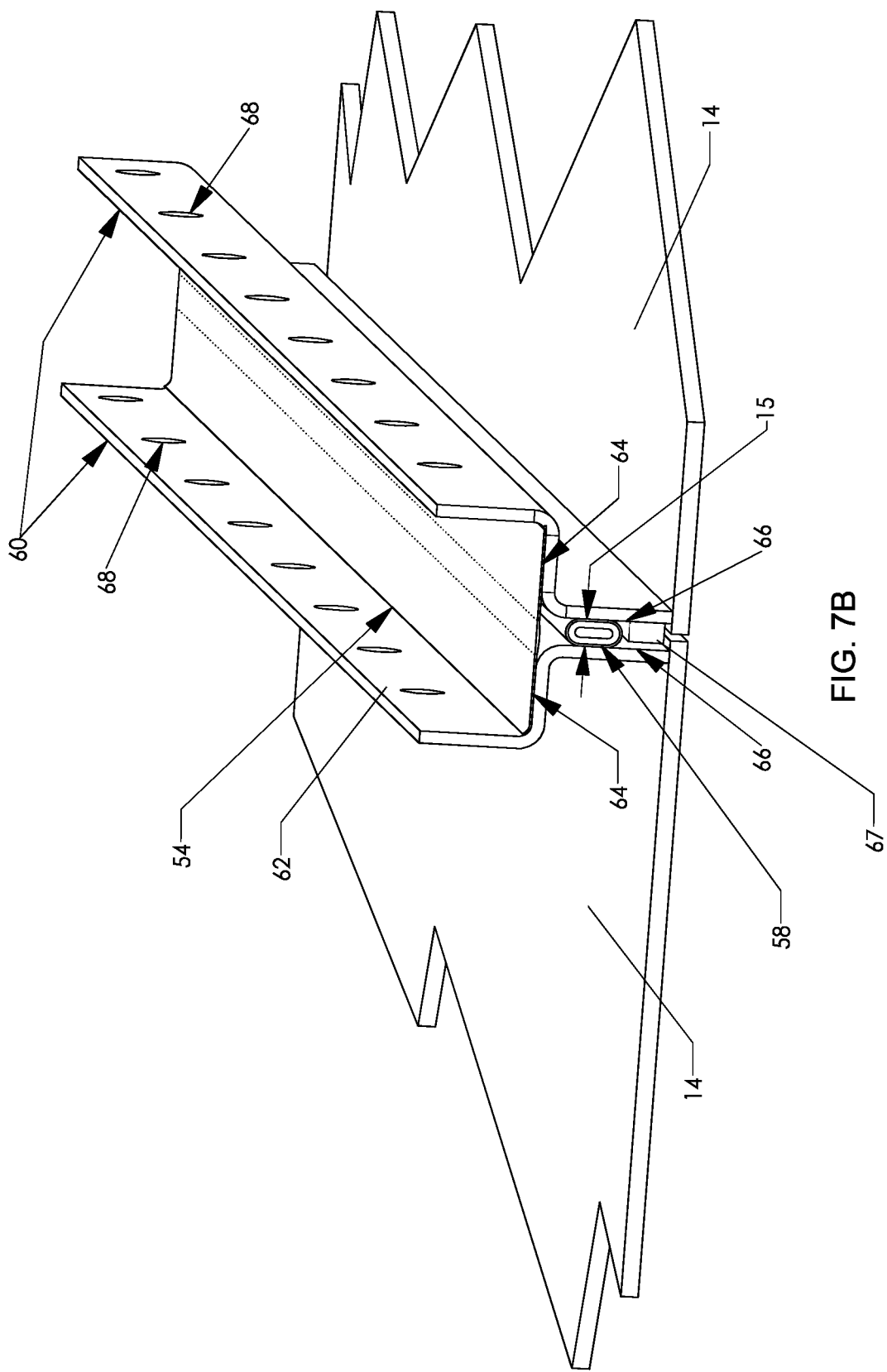
FIG. 7B depicts a perspective view of the electromagnetic seal of FIG. 7A being installed, showing a second support of the electromagnetic seal aligned with the first support.

The seal (50) is thereby designed to be easily installed at the building destination without special tooling and with minimal instruction. In some instances, the seal (50) may be reusable such that the seal (50) may be re-installed between building modules (10) with the replacement of the consumable materials (e.g., gasket assembly (58) and/or tape (54)). To install the seal (50), a support (60) may be welded to a surface of a building module (10) during the manufacturing process, as shown in FIG. 7A. In the illustrated embodiment, the free end of the third wall (66) of the support (60) is attached to an end of the interior surface of the floor (14) such that the support (60) extends inwardly from the floor (14). In some other versions, the support (60) is attached to other areas of the building module (10), such as at the seams of the end walls (12) and/or the ceiling (16). The support (60) can be attached to the building module (10) by welding or any other suitable method. Two building modules (10) can then be placed side by side, as shown in FIG. 7B, such that an interior surface of a first support (60) is aligned with an interior surface of a second support (60). This forms a channel between the first walls (62) of the corresponding supports (60). One or more compression stops (67) is positioned between the third walls (66) of the supports (60). Additionally or alternatively, the seal (50) may be applied to the end walls (12) of adjoining building modules (10) such that the building modules (10) may be joined end to end.

The gap (15) between the third walls (66) of the supports (60) can then be adjusted such that the one or more compression stops (67) can be adjoined during this adjustment. For instance, when multi section building modules (10) are installed, the adjoining surfaces of the building modules (10) rarely make 100% contact across the joint. Ground conditions at the building module (10) deployment site and the flexibility of the steel building modules (10) typically cause dimensional variances. Even the most level concrete pad (2) may have some high and low areas. These differences in elevation and associated slope may cause the gap (15) and supports (60) to fluctuate in relationship to one another such that the gap (15) may need to be adjusted onsite.

Figure 7C:
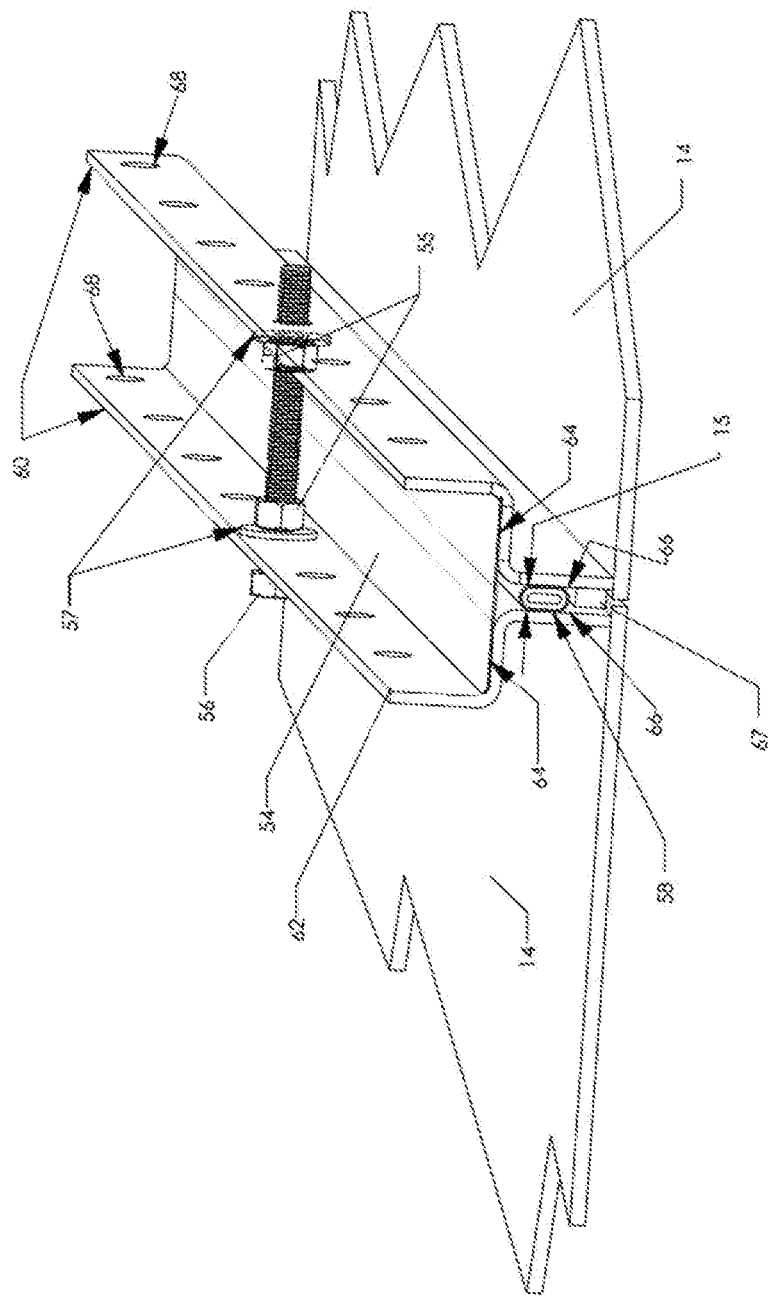
FIG. 7C depicts a perspective view of the electromagnetic seal of FIG. 7B being installed, showing the position between the first support and the second support being adjusted by a bolt.
Figure 7D:
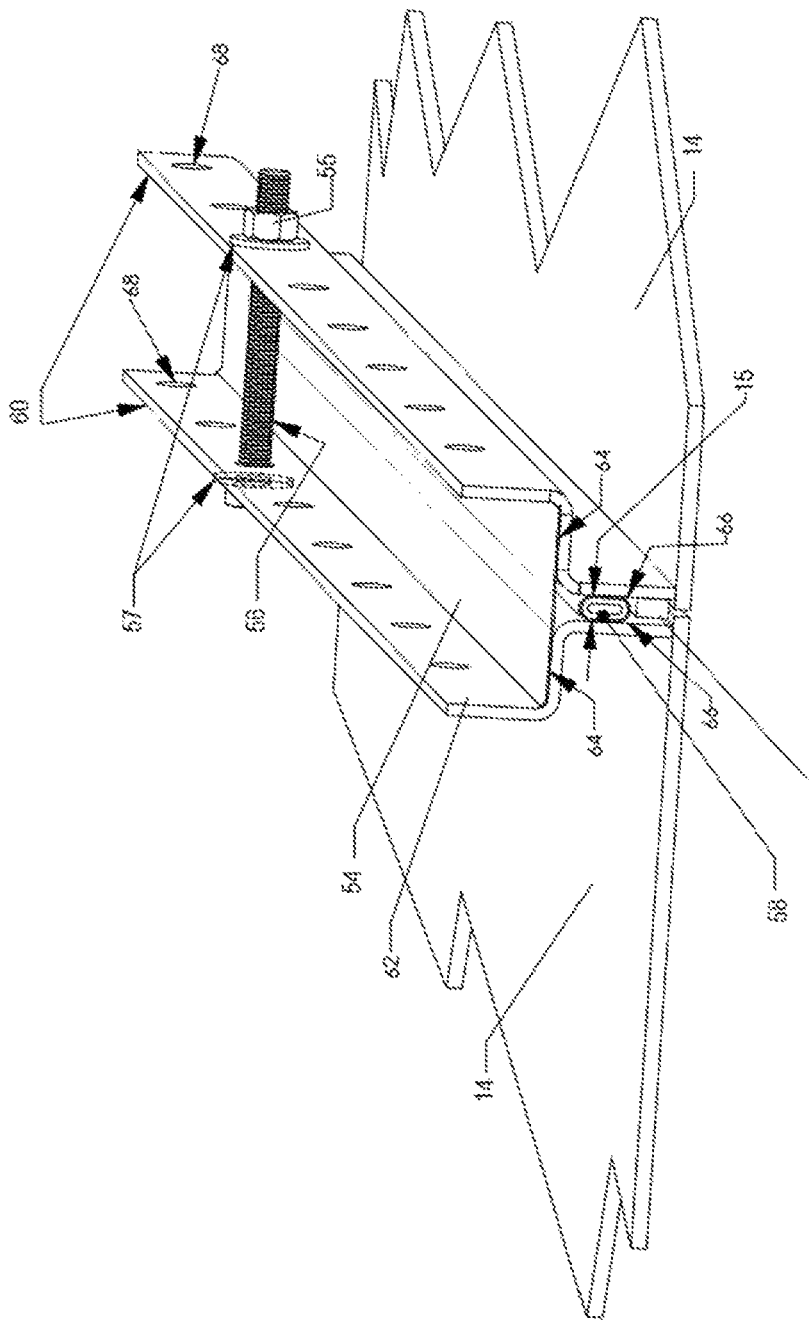
FIG. 7D depicts a perspective view of the electromagnetic seal of FIG. 7C being installed, showing the fixed position between the first support and the second support.

As shown in FIG. 7C, the bolt (56) is inserted through selected aligned openings (68) on the first wall (62) of each support (60). In the illustrated embodiment, a washer (57) and a nut (55) is placed on the bolt (56) on the interior surface of each first wall (62) of the supports (60). The nut (55) can be then rotated relative to the bolt (56) to loosen and/or tighten the nut (55) relative to the bolt (56) to thereby adjust the gap (15) between the supports (60). Once a desired gap (15) is achieved, another nut (55) can be place on the free end of the bolt (56) on an exterior surface of the first wall (62) of the support (60) to fix the gap (15), as shown in FIG. 7D. In the illustrated embodiment, the supports (60) can be adjusted to provide a gap (15) of between about 0 and about 0.375 inches, but other suitable gap sizes may be provided. For instance, since the steel building modules (10) are somewhat flexible, the size of the gap (15) may vary due to ground conditions. The seal (50) may also accommodate for both tolerance variation and scrapping forces encountered during installation.

The size of the gap (15) between supports (60) further determines the installation gasket groove spacing. The gasket assembly (58) can be pressed into the gap (15) using a modified putty knife. For instance, the gasket assembly (58) may be inserted between two corresponding supports (60) until the gasket assembly (58) abuts the one or more compression stops (67) of the supports (60), as shown in FIG. 7D. This forms a contact region, which serves to bridge the conductivity between the adjoined building modules (10). The tape (54) may then be placed over the gasket assembly (58) between the supports (60), as shown in FIG. 7D, such that the tape (54) is adhered on a top surface of the second walls (64) of the supports (60). The tape (54) can be applied using a narrow roller to seal its edges. Any wrinkles in the tape (54) may be burnished flat with the roller. Other suitable installation methods for the seal (50) will be apparent to one with ordinary skill in the art in view of the teachings herein.

The seal (50) is thereby easily installed between building modules (10) to the seal module seam joints such that the wire mesh gasket assembly (58) bridges the gap between the supports (60) of adjacent building segments. Accordingly, the resultant electromagnetic seal (50) may perform electrically as if it were a continuous steel weld to form a Faraday Cage seam necessary for preventing the transmission of electromagnetic energy. With the gasket assembly (58) compressed between the supports (60), the building module (10) seam utilizes compressive force and conductive adhesive to complete the Faraday Cage.

In some versions, metallization is applied to the selected portions of the seal (50), such as the steel support (60) surfaces that contact the wire mesh gasket assembly (58) and/or where the laminate tape (54) contacts the surface of the supports (60). The protected areas of the metalized supports (60) can make electrical contact with the surface of the supports (60). This may allow peak electrical conductivity performance in the seal assembly (50). The metallization may comprise tin, aluminum, molybdenum, nickel, copper, antimony, and/or lead. The metallization may be applied in several layers with tin as the top coat. The conductive materials used in this seal (50) assembly have galvanic compatibility and corrosion resistance to maintain a long building module (10) life. Other suitable configurations for protecting the surfaces of the seal (50) will be apparent to one with ordinary skill in the art in view of the teachings herein.

EXAMPLES

Example 1

An electromagnetic seal comprising a gasket assembly positioned between a pair of supports, wherein the seal is conductive such that it is operable to prevent the transmission of electromagnetic energy through the seal.

Example 2

The seal of example 1, wherein the gasket assembly comprises a wire mesh wrapped about a tube.

Example 3

The seal of example 1 or 2, wherein each support comprises a first wall, a second wall extending inwardly from an end of the first wall, and a third wall extending downwardly from an opposing end of the second wall such that each support forms a Z-shape configuration.

Example 4

The seal of example 3, wherein each support comprises a rounded corner between the first wall and the second wall, and wherein each support comprises a rounded corner between the second wall and the third wall.

Example 5

The seal of example 3 or 4, wherein the pair of supports are positioned adjacent with each other such that an interior surface of each of the third walls are aligned with each other to provide a gap between the interior surfaces of each of the third walls, wherein a channel is formed between the first walls of the pair of supports.

Example 6

The seal of example 5, wherein the gasket assembly is compressible between the third walls of the pair of supports.

Example 7

The seal of example 6, wherein at least one support of the pair of supports comprises a stop positioned on the third wall of the at least one support, wherein the gasket assembly is positioned adjacent to the stop.

Example 8

The seal of any of examples 5 to 7, further comprising a tape adhered to the second walls of each of the supports to cover the gap between the third walls.

Example 9

The seal of any of examples 5 to 8, wherein the first wall of each support comprises at least one opening, wherein a bolt is inserted within the at least one opening of each support.

Example 10

The seal of example 9, wherein a size of the gap is adjustable based on rotation of the bolt.

Example 11

The seal of any of the examples 1 to 10, wherein at least a portion of the seal is metalized.

Example 12

An electromagnetic seal comprising:
a first support extending inwardly from an end of a first building module;
a second support extending inwardly from an end of a second building module; and
a gasket assembly positioned between the first support and the second support;
wherein the seal is configured to prevent transmission of electromagnetic energy between the first building module and the second building module.

Example 13

The seal of example 12, wherein the first support, the second support, and the gasket assembly comprise metal such that the seal is conductive between the first support and the second support through the gasket assembly.

Example 14

The seal of examples 12 or 13 further comprising a stop positioned between the first support and the second support such that the stop forms a gap between the first support and the second support.

Example 15

The seal of any of the examples 12 to 14 further comprising an adjusting device for adjusting a gap between the first support and the second support.

Example 16

A method of installing an electromagnetic seal for preventing the transmission of radio-frequency energy between corresponding walls of adjoining building modules, the method comprising the steps of:
attaching a support to an interior surface of a building module;
adjoining at least two building modules to align the support on each building module with another support; and
inserting a gasket assembly between the aligned supports such that the gasket assembly is compressed between the aligned supports.

Example 17

The method of example 16 further comprising inserting a fastener through each of the aligned supports to fix the position of the aligned supports relative to each other.

Example 18

The method of example 17 further comprising adjusting a gap between the aligned supports via the fastener before the position of the aligned supports is fixed.

Example 19

The method of any of the examples 16 to 18 further comprising applying a tape onto the aligned fasteners such that the tape covers the gasket assembly.

Example 20

The method of any of the examples 16 to 19 further comprising metalizing at least a portion each support and the gasket assembly.

Having shown and described various embodiments of the present invention, further adaptations of the methods and systems described herein may be accomplished by appropriate modifications by one of ordinary skill in the art without departing from the scope of the present invention. Several of such potential modifications have been mentioned, and others will be apparent to those skilled in the art. For instance, the examples, embodiments, geometrics, materials, dimensions, ratios, steps, and the like discussed above are illustrative and are not required. Accordingly, the scope of the present invention should be considered in terms of any claims that may be presented and is understood not to be limited to the details of structure and operation shown and described in the specification and drawings.

We claim:

1. An electromagnetic seal comprising a gasket assembly positioned between a pair of supports, wherein the gasket assembly comprises a wire mesh wrapped about a tube, wherein each support comprises a first wall, a second wall extending inwardly from an end of the first wall, and a third wall extending downwardly from an opposing end of the second wall, wherein the pair of supports are positioned adjacent with each other such that an interior surface of each of the third walls are aligned with each other to provide a gap between the interior surfaces of each of the third walls, wherein a channel is formed between the first walls of the pair of supports, wherein the first wall of each support comprises at least one opening, wherein a bolt is inserted within the at least one opening of each support, wherein the seal further comprises a tape adhered to the second walls of each of the supports to cover the gap between the third walls, wherein the seal is conductive such that it is operable to prevent the transmission of electromagnetic energy through the seal.

2. The seal of claim 1, wherein each support comprises a rounded corner between the first wall and the second wall, and wherein each support comprises a rounded corner between the second wall and the third wall.

3. The seal of claim 1, wherein the gasket assembly is compressible between the third walls of the pair of supports.

4. The seal of claim 3, wherein at least one support of the pair of supports comprises a stop positioned on the third wall of the at least one support, wherein the gasket assembly is positioned adjacent to the stop.

5. The seal of claim 1, wherein a size of the gap is adjustable based on rotation of the bolt.

6. The seal of claim 1, wherein at least a portion of the seal is metalized.

7. An electromagnetic seal comprising:
a first support extending inwardly from an end of a first building module;
a second support extending inwardly from an end of a second building module;
a gasket assembly positioned between the first support and the second support, wherein the gasket assembly comprises a wire mesh wrapped about a tube;
wherein each of the first and second supports comprise a first wall, a second wall extending inwardly from an end of the first wall, and a third wall extending downwardly from an opposing end of the second wall, wherein the first and second supports are positioned adjacent with each other such that an interior surface of each of the third walls are aligned with each other to provide a gap between the interior surfaces of each of the third walls, wherein a channel is formed between the first walls of the first and second supports, wherein the first wall of each support comprises at least one opening, wherein a bolt is inserted within the at least one opening of each support; and a tape adhered to the second walls of each of the first and second supports to cover the gap between the third walls;

wherein the seal is configured to prevent transmission of electromagnetic energy between the first building module and the second building module.

8. The seal of claim 7, wherein the first support, the second support, and the gasket assembly comprise metal such that the seal is conductive between the first support and the second support through the gasket assembly.

9. The seal of claim 7 further comprising a stop positioned between the first support and the second support such that the stop forms a gap between the first support and the second support.

10. The seal of claim 7 further comprising an adjusting device for adjusting a gap between the first support and the second support.

11. A method of installing an electromagnetic seal for preventing the transmission of electromagnetic energy between corresponding walls of adjoining building modules, wherein the seal comprises a gasket assembly positioned between a pair of supports, wherein the gasket assembly comprises a wire mesh wrapped about a tube, wherein each support comprises a first wall, a second wall extending inwardly from an end of the first wall, and a third wall extending downwardly from an opposing end of the second wall, wherein the pair of supports are positioned adjacent with each other such that an interior surface of each of the third walls are aligned with each other to provide a gap between the interior surfaces of each of the third walls, wherein a channel is formed between the first walls of the pair of supports, wherein the first wall of each support comprises at least one opening, wherein a fastener is inserted within the at least one opening of each support, wherein the seal further comprises a tape adhered to the second walls of each of the supports to cover the gap between the third walls, the method comprising the steps of:

attaching a support to an interior surface of a building module;

adjoining at least two building modules to align the support on each building module with another support; and inserting a gasket assembly between the aligned supports such that the gasket assembly is compressed between the aligned supports.

12. The method of claim 11 further comprising inserting the fastener through each of the aligned supports to fix the position of the aligned supports relative to each other.

13. The method of claim 12 further comprising adjusting a gap between the aligned supports via the fastener before the position of the aligned supports is fixed.

14. The method of claim 11 further comprising metalizing at least a portion each support and the gasket assembly.

* * * * *